United States Patent [19]

Shulenberger

[11] Patent Number: 4,740,135
[45] Date of Patent: Apr. 26, 1988

[54] WAFER TRANSFER ARM MECHANISM

[75] Inventor: Arthur Shulenberger, Capitola, Calif.

[73] Assignee: SCSS Instruments, Santa Cruz, Calif.

[21] Appl. No.: 817,279

[22] Filed: Jan. 8, 1986

[51] Int. Cl.⁴ ............................................. B65G 7/00
[52] U.S. Cl. ..................................... 414/749; 108/20;
198/468.6
[58] Field of Search ............... 414/722, 680, 728, 733,
414/743, 749, 331, 696; 198/468.6, 375; 74/479;
108/137, 20; 29/740

[56] References Cited

U.S. PATENT DOCUMENTS

| | | | |
|---|---|---|---|
| 2,948,417 | 8/1960 | Haanes | 414/733 |
| 3,317,004 | 5/1967 | Harrison et al. | 414/680 X |
| 3,823,836 | 7/1974 | Cheney et al. | 414/225 |
| 4,108,323 | 8/1978 | Shambelan et al. | 414/417 |
| 4,365,561 | 12/1982 | Tellier et al. | 108/20 X |
| 4,382,743 | 5/1983 | Newell | 414/728 X |
| 4,393,920 | 7/1983 | Shima et al. | 414/728 X |
| 4,427,332 | 1/1984 | Manriquez | 414/331 |
| 4,457,661 | 7/1984 | Flint et al. | 414/404 |
| 4,501,527 | 2/1985 | Jacoby et al. | 414/225 |
| 4,584,896 | 4/1986 | Letovsky | 74/479 |

OTHER PUBLICATIONS

Fegley, C. Abraham, "Automatic Wafer Transfer and Turnover Tool" *Western Electric Technical Digest,* Jan. 1978, No. 49.

*Primary Examiner*—Robert J. Spar
*Assistant Examiner*—Donald W. Underwood

[57] ABSTRACT

A transfer arm mechanism including a base assembly, a pivoting arm extending generally upwardly from the base assembly, a wafer support paddle, and mechanisms for pivoting the arm back and forth while maintaining the wafer support paddle in a horizontal plane. A base assembly includes a rotatable plate which can rotate the mechanism through 360°, and a support plate which can be moved up and down along guide posts attached to the rotatable plate. The mechanism for moving the wafer paddle along a horizontal plane includes a cam member attached to the support plate, and a cam follower which rolls along an upper surface of the cam member to compensate for the pivoting action of the arm assembly. A mechanism is also provided to prevent the wafer paddle from tipping which includes a drive chain extending between a gear which is rotationally fixed with respect to the support plate and a gear which is attached to a pivot pin supporting the wafer paddle.

9 Claims, 4 Drawing Sheets

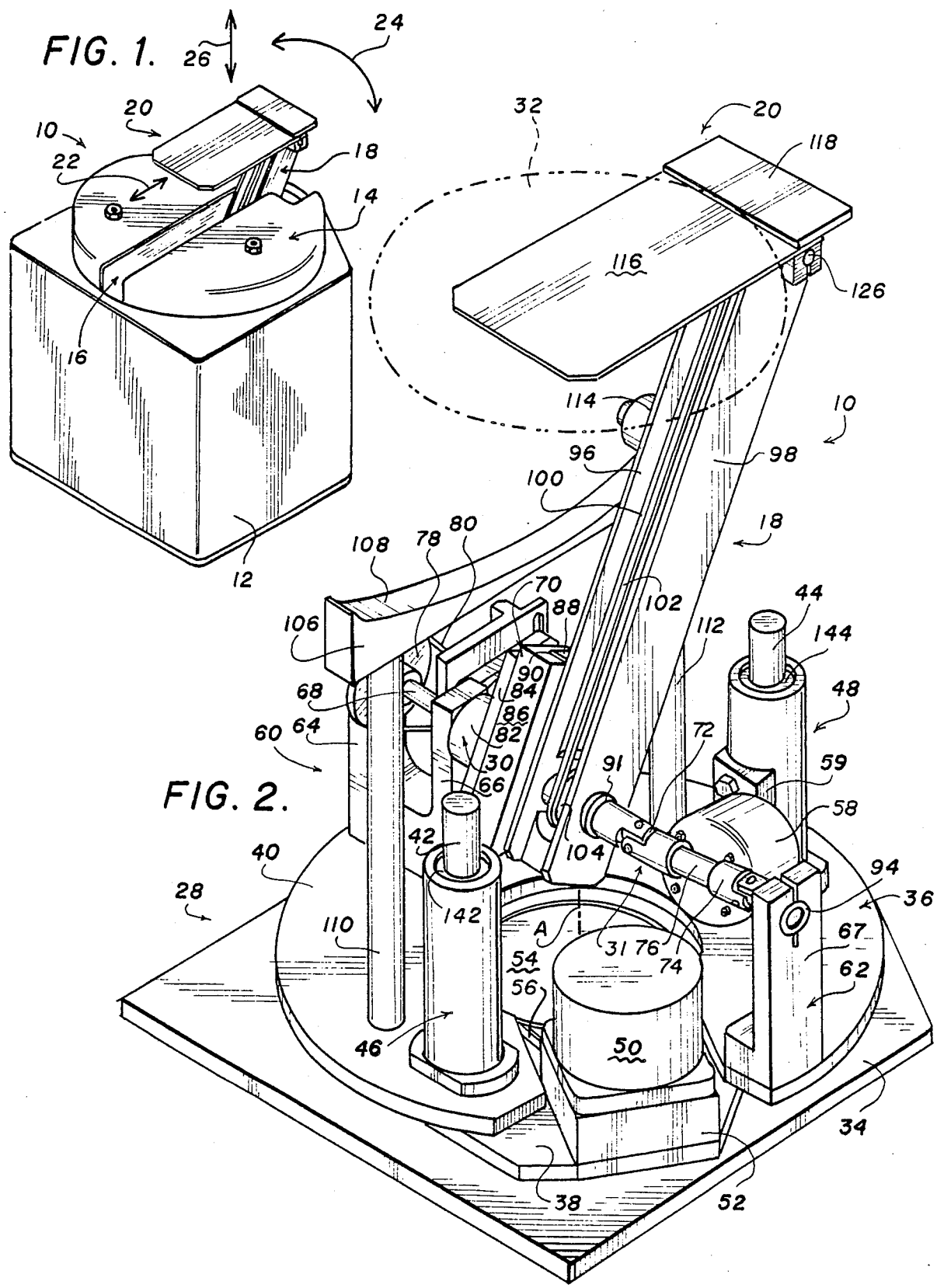

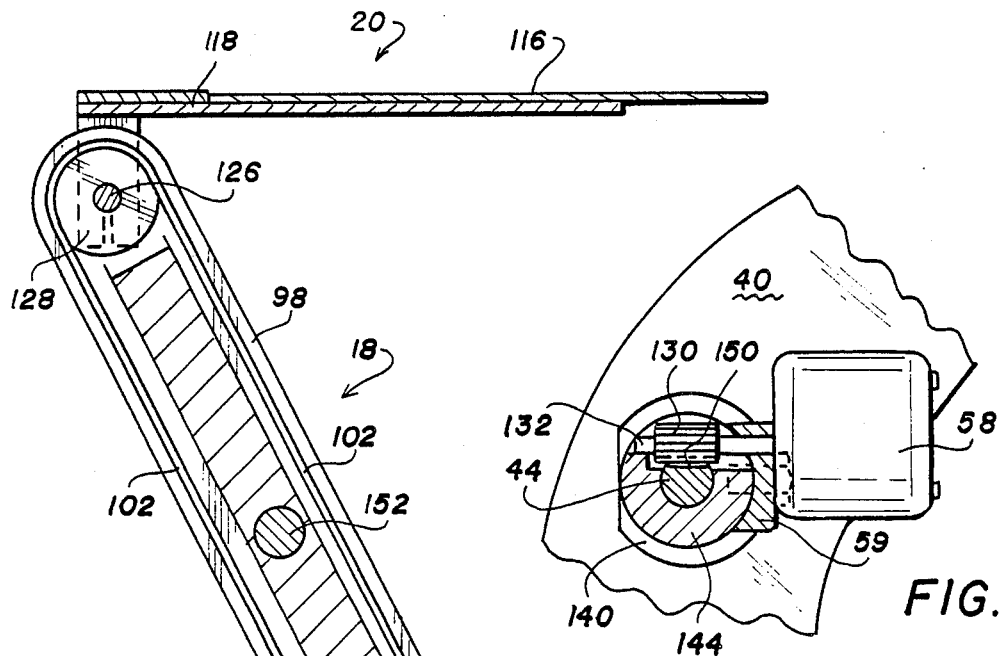
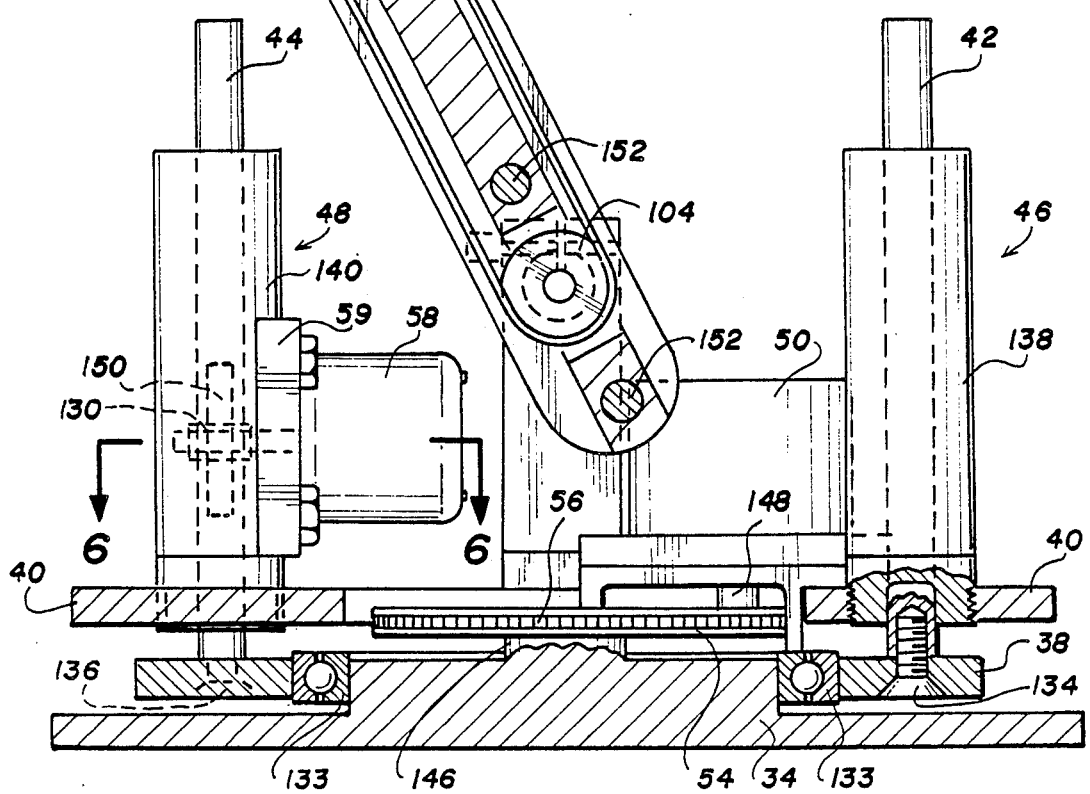
FIG. 5.
FIG. 6.

WAFER TRANSFER ARM MECHANISM

BACKGROUND OF THE INVENTION

1. Field of the Invention

This invention relates generally to robotic arms, and more particularly to robotic arms for lifting, moving, and placing semiconductor wafers.

2. Description of the Prior Art

Solid state electronic devices are made from semiconducting materials such as silicon, germanium, and gallium arsenide. The semiconducting materials are "grown" by placing a seed of semiconducting material having the correct crystal structure into a vat of melted semiconductor material and then slowly withdrawing the seed from the vat to form a long, tubular slug of material. The slug is then sliced into thin wafers which are further processed to make the final semiconductor devices.

The semiconductor manufacturing industry is becoming more and more competitive. It therefore behooves semiconductor manufacturers to increase productivity by reducing labor costs, and to minimize damage and contamination during the processing of the semiconductor devices.

One way to accomplish both of these goals is to automate the wafer handling process. For example, if a robot arm can be used to transfer wafers in and out of a cassette, or to perform similar tasks, labor costs and the possibility of human contamination of the wafers are greatly reduced.

There are many examples of robotic-type assemblies designed to handle semiconductor wafers. For example, in U.S. Pat. No. 4,108,323 of Shambelan et al. an apparatus is disclosed which has a wafer handling arm which moves a paddle in and out of a cassette to pick up or deposit a semiconductor wafer. Another example can be found in U.S. Pat. No. 4,427,332 of Manrikuez which teaches a wafer transfer device having a paddle which lifts a wafer from a cassette and positions it under an inspection microscope. Furthermore, U.S. Pat. No. 4,501,527 of Jacoby et al., U.S. Pat. No. 3,823,836 Cheney et al., and Western Electric Technical Digest #49 (January, 1978) all teach pivoting arms having vacuum paddles which can remove a wafer from a cassette and transfer it to a work station. Finally, U.S. Pat. No. 4,457,661 of Flint et al. teaches a wafer loading apparatus which includes processing trays mounted on a generally cylindrical carousel. Wafers are transferred in and out of the cassettes with vacuum paddles.

A problem with wafer transfer arms of the prior art is that they tend to be specialized pieces of equipment, and are not well adapted for use as original equipment manufacturer (OEM) subassemblies. As such, they are often manufactured on an individual basis, and thus tend to be expensive.

Another problem with wafer transfer arms of the prior art is that they are not particularly compact in construction. The mechanisms of the wafer transfer arms of the prior art often require housings which are much longer than the length of their stroke.

Another problem with wafers transfer arms of the prior art is that they often contaminate the semiconductor wafers that they are transporting. This is due primarily to the fact that the mechanisms which operate the wafer transfer arms are often quite close to the wafers being transported, allowing grease, fumes, etc. to contaminate the wafers.

SUMMARY OF THE INVENTION

An object of this invention is to provide a simple, efficient transfer arm mechanism for semiconductor wafers.

Another object of this invention is to provide a wafer transfer arm mechanism that fits within a housing that is not substantially longer than the stroke of the wafer transfer arm.

Yet another object of this invention is to provide a wafer transfer arm mechanism which does not contaminate the semiconductor wafers being transported.

Yet another object of this invention is to provide a wafer transfer arm which is modular in construction, and thus is well adapted for OEM applications.

Briefly, the wafer transfer arm includes a base assembly, an arm pivotally supported over the base assembly in a generally upward orientation, a wafer transport paddle, and mechanisms for pivoting the arm back and forth while maintaining the wafer transfer paddle in a substantially horizontally plane. The paddle has three degrees of motion, namely: back and forth along a substantially horizontal plane; vertically up and down; and in a circular path along a horizontal plane.

An advantage of this invention is that the horizontal stroke of the transfer arm is substantially the entire length of the housing which encloses the mechanism, permitting very compact construction.

Another advantage of this invention is that most of the parts of the mechanism which might produce contamination, such as motors or greased bearings, are located far away from the paddle which supports the semiconductor wafers.

A still further advantage of this invention is that it is a self contained modular unit, and thus well adapted for OEM applications.

These and other objects and advantages of the present invention will no doubt become apparent upon a reading of the following descriptions and a study of the several figures of the drawing.

DESCRIPTION OF THE DRAWINGS

FIG. 1 is a perspective view of a transfer arm mechanism in accordance with the present invention;

FIG. 2 is an enlarged, perspective view of the transfer arm mechanism with the outer housing removed;

FIG. 5 is a cross sectional view taken along line 5—5 of FIG. 4; and

FIG. 6 is a cross sectional view taken along line 6—6 of FIG. 5.

DETAILED DESCRIPTION OF THE PREFERRED EMBODIMENT(S)

Figure 3:
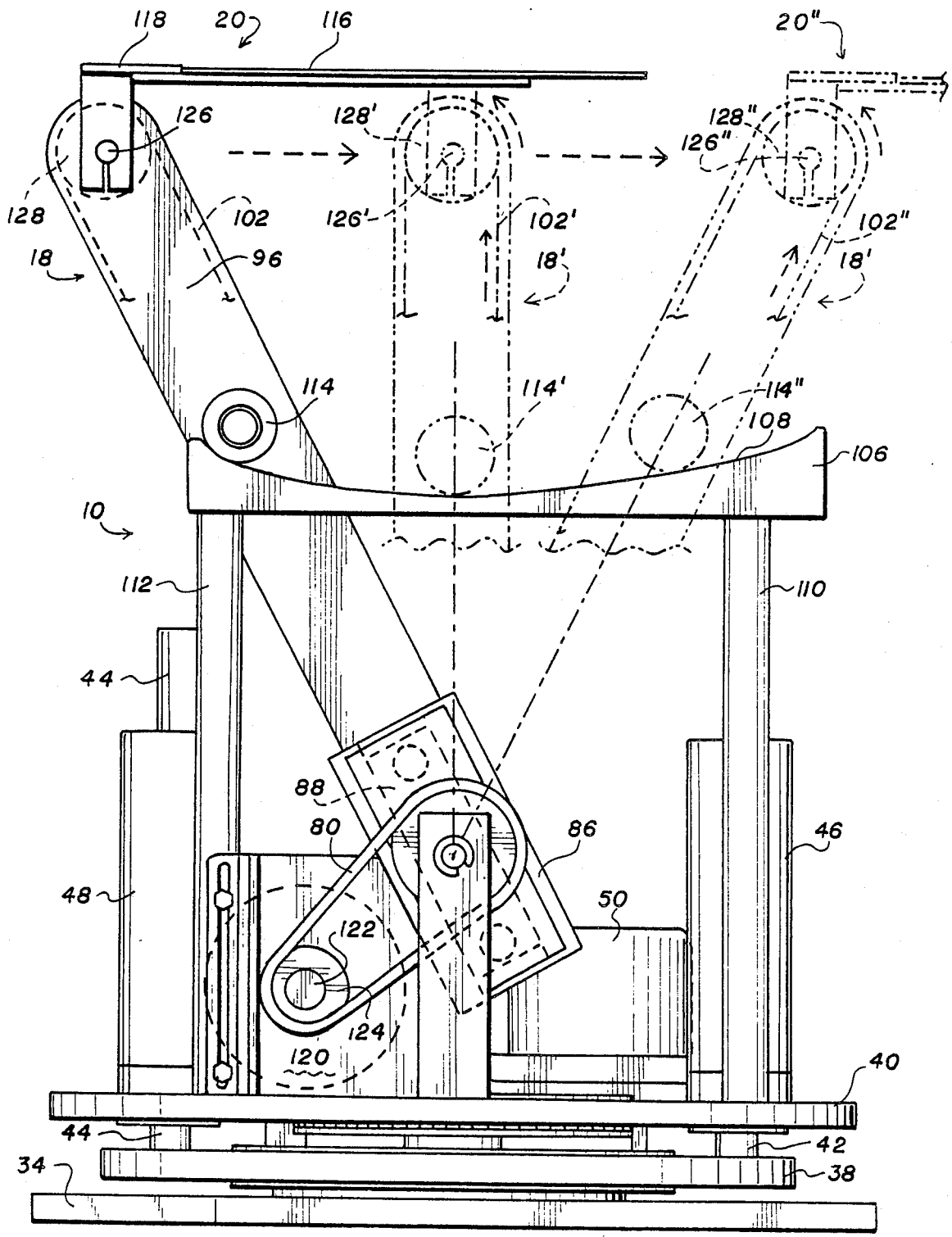
FIG. 3 is a partially broken, elevational view of the transfer arm mechanism shown in FIG. 2.

Referring to FIG. 1, a transfer arm mechanism 10 in accordance with the present invention includes a housing 12, a rotatable cover 14 having an opening 16, an arm assembly 18 extending through opening 16, and a paddle assembly 20 attached to the end of arm assembly 18. As will be discussed in greater detail subsequently, paddle assembly 20 can move back and forth as indicated by arrow 22; rotated as indicated by arrow 24; and move vertically up and down as indicated by arrow 26.

These three degrees of freedom of motion for the paddle assembly 20 permits semiconductor wafers to be picked up, moved, and deposited in an automatic fashion.

Referring now to the perspective view of FIG. 2 wherein the housing 12 and cover 14 have been removed, transfer arm mechanism 10 includes a base assembly 28, a rotatable axle assembly 30, and a fixed axle assembly 31. Rotatable axle assembly 30 and fixed axle assembly 31 cooperate to pivotally support arm assembly 18 above the base assembly 28. A semiconductor wafer 32, shown in phantom, is supported by the paddle assembly 20.

The base assembly 28 includes a fixed base member 34, and a turntable assembly 36. The turntable assembly 36 includes a rotary plate 38 coupled to base member 34, and a support plate 40 adapted to rotate with rotary plate 38. The support plate 40 is coupled to rotary plate 38 by a pair of posts 42 and 44 which are attached to rotary plate 38 and by slide bearing assemblies 46 and 48 which are attached to support plate 40 and which engage posts 42 and 44, respectively. Posts 42 and 44 are substantially parallel to the axis of rotation A of turntable assembly 36.

As will be discussed in greater detail subsequently, a motor 50 is attached to a rotary plate 38 by a pedestal assembly 52. The motor 50 has a rotary output shaft which is coupled to a fixed gear 54 of fixed base member 34 by a drive chain 56. When motor 50 is activated, the entire turntable assembly 36 is caused to rotate. Since arm assembly 18 is supported by the turntable assembly 36, rotation of turntable assembly 36 causes the rotation of the paddle assembly 20 as indicated by arrow 24 in FIG. 1. The turntable assembly 36 can rotate through 360°

Still with reference to FIG. 2, another motor 58 is attached to slide bearing assembly 48 by a flange 59. As will be discussed in greater detail subsequently, the motor 58 has a pinion attached to its rotary shaft which engages teeth provided on post 44. By activating motor 58, the support plate 40 can be caused to move up and down relative to rotary plate 38, causing the up and down motion of paddle assembly 20 indicated by arrow 26 in FIG. 1.

Rotatable axle assembly 30 is supported above support plate 40 by an axle support assembly 60. Similarly, fixed axle assembly 31 is supported above support plate 40 by an axle support assembly 62. The axle support assembly 60 is bifurcated so as to have two upwardly extending fingers 64 and 66, and axle support assembly 62 includes a single, upwardly extending finger 67.

The rotatable axle assembly 30 and fixed axle assembly 31 are designed to pivotally support arm assembly 18 near its lower end, and to allow arm assembly 18 to pivot back and forth. To accomplish this, rotatable axle assembly 30 includes a shaft 68 which extends between fingers 64 and 66 of axle support assembly 60, and a slide bearing assembly 70. Fixed axle assembly 31 includes a universal joint 72, another universal joint 74, and a slide shaft 76 which couples universal joints 72 and 74 together.

A gear 78 is attached to shaft 68 of axle assembly 30, and can be caused to rotate by a drive chain 80. Rotation of gear 78 causes a corresponding rotation of shaft 68. The shaft 68 is attached to an enlarged shaft section 82 for mutual rotation. The shaft section 82 is attached to a plate 84 which is, in turn, attached to an outer race 86 of slide bearing assembly 70. A runner 88 engages a longitudinal slot 90 of race 86, and is attached to arm assembly 18. When gear 78 is rotated by drive chain 80, a corresponding rotation is imposed upon shaft 68, shaft section 82, plate 84, slide bearing assembly 70, and arm assembly 18.

Figure 4:
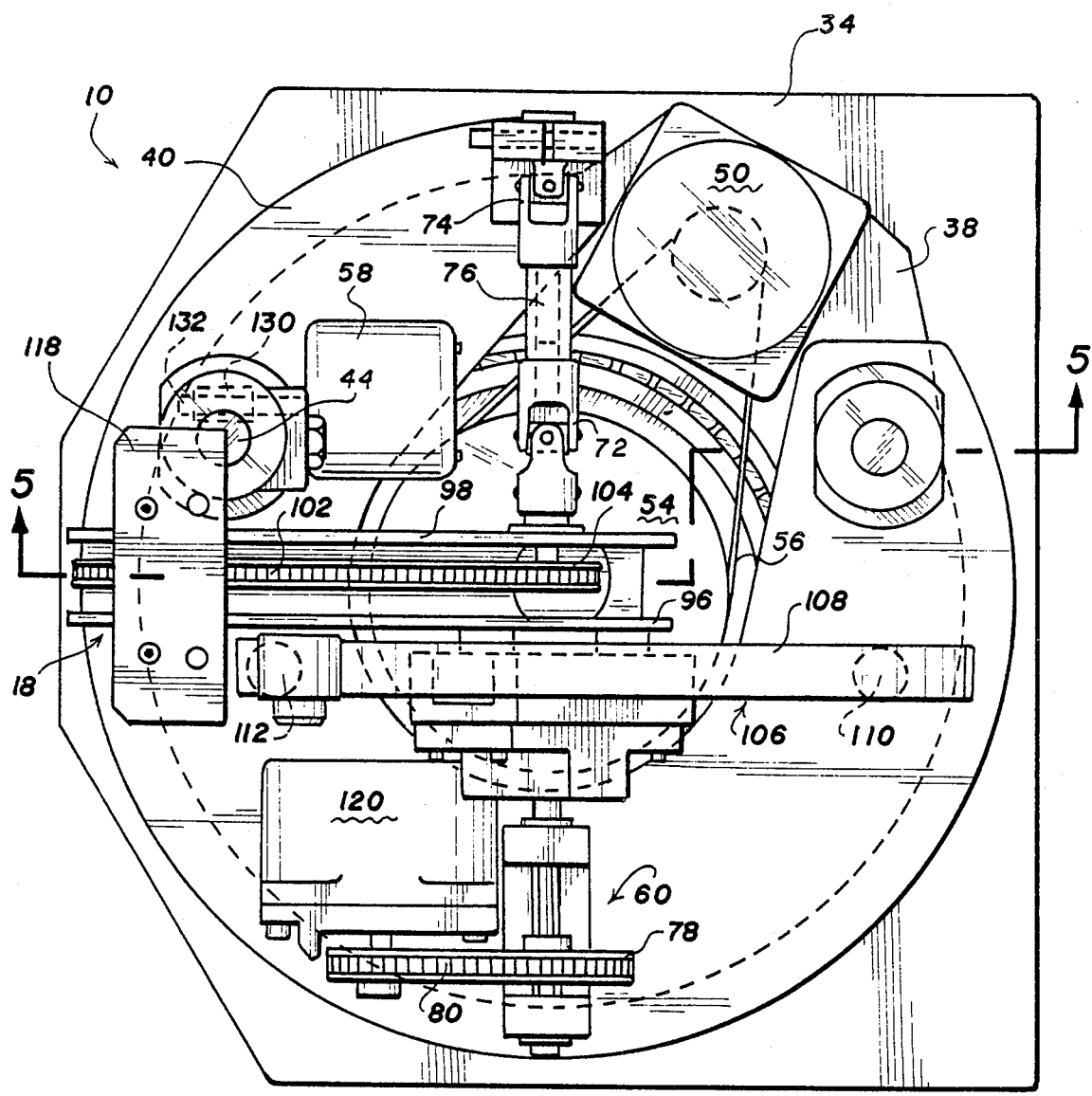
FIG. 4 is a top plan view of the transfer arm mechanism shown in FIG. 2 with the transfer paddle removed.

Universal joint 72 is coupled to arm assembly 18 by a bearing 91, and thus does not rotate with the arm assembly. Referring briefly to FIG. 4, universal joint 72 is attached to universal joint 74 by a slide shaft 76 which can elongate and contract, as required. Universal joint 74 is rotatably coupled to axle support assembly 62 by a bearing 94.

As will be discussed with greater detail with reference to FIG. 3, the slide bearing assembly 70 and U-joints 72 and 74 permit arm assembly 18 to move up and down relative to support plate 40 so that paddle assembly 20 can remain in a constant, horizontal plane as the arm assembly 18 is pivoted back and forth.

Arm assembly 18 has a pair of frame members 96 and 98, and has an inner core 100. A drive chain 102 is trained around a gear 104 which is attached to U-joint 72. In consequence, gear 104 does not rotate with respect to support plate 40. As will be discussed in greater detail with reference to FIGS. 3 and 5, the drive chain 102 maintains the horizontal position of paddle assembly 20 as the arm assembly 18 is pivoted back and forth.

A cam 106 having an arcuate cam surface 108 is attached to support plate 40 by a pair of posts 110 and 112. A rotary cam follower 114 is attached to frame member 96 of arm assembly 18, and rests upon cam surface 108. The purpose of cam 106 is to prevent paddle assembly 20 from moving up and down as arm assembly 18 is pivoted back and forth.

Paddle assembly 20 includes a paddle 116 and a paddle holder 118. The paddle 116 can be removed from the paddle holder 118, and other paddles can be substituted for it. For example, different shapes and sizes of paddles 116 can be engaged with paddle holder 118 to accommodate wafers of varying sizes.

In FIG. 3, the transfer arm mechanism 10 is shown in a side elevation view. A motor 120 having a rotary output shaft 122 engages drive chain 80 by means of a gear 124. By activating motor 120, arm assembly 18 can be caused to pivot to positions 18' and 18", as shown in broken lines. Thus, the motor 120 can be used to cause the paddle assembly 20 to move back and forth as indicated by arrow 22 in FIG. 1.

If the rotatable axle assembly 30 were a fixed pivot for arm assembly 18, the paddle assembly 20 would move through an arc as arm assembly 18 moved from the position shown at 18 to the position shown at 18". Since it is highly desirable to have the paddle assembly 20 move along a fixed plane P, cam 106 and cam follower 114 are used to compensate for the arc of the arm assembly as it pivots. The cam surface 108 is the lowest in the center where the arm 18' would tend to be at its highest position, and is higher at its ends at 18 and 18" where the arm assembly would be at lower positions. Slide bearing assembly 70 and fixed axle assembly 31 permit the movements of the arm assembly 18 that are required to keep the paddle assembly 20 in the plane P.

It is also desirable that the paddle assembly 20 be maintained in a horizontal or flat position within plane P. To accomplish this, paddle holder 118 is attached to a pivot pin 126 which extends through arm assembly 18. Attached to pivot pin 126 is a gear 128 which engages the drive chain 102. As the arm assembly moves to the position shown at 18', the drive chain 102' rotates in a counterclockwise direction as indicated, causing gear 128' to also rotate in a counterclockwise direction. This causes a corresponding rotation of pivot pin 126' which pivots paddle assembly 20 to exactly compensate for the pivoting of the arm assembly 18. The same process occurs when the arm assembly moves to 18".

In FIG. 4, the transfer arm mechanism 10 is shown in top plan view with the paddle 116 removed from the paddle holder 118. In this view, motor 50 is clearly seen to be coupled to fixed gear 54 by drive chain 56, and motor 120 is attached to gear 78 by drive chain 80. When motor 120 is activated, the arm assembly 18 is pivoted as described previously, while gear 104 remains stationary due to its attachment to universal joint 72. This causes a relative rotation between drive chain 102 and arm assembly 18 which causes the paddle assembly 20 to maintain its horizontal position, as was previously described with reference to FIG. 3. Also seen in this view is a pinion 130 attached to a rotary shaft 132 of motor 58. The pinion 130 engages teeth on post 44 to drive support plate 40 up and down.

Referring now to the cross sectional view of FIG. 5, rotary plate 38 is coupled to fixed base member 34 by a bearing assembly 134. Posts 42 and 44 are attached to rotary plate 38 by screw fasteners 134 and 136, respectively. The outer casings 138 and 140 of slide bearing assemblies 46 and 48, respectively, are provided with threads at their lower ends which engage threaded bores provided in support plate 40. Slide bearings 142 and 144 (see FIG. 2) are housed within casin9s 138 and 140, respectively, to provide a low friction sliding bearing surface between the bearing assemblies 46 and 48 and posts 42 and 44, respectively.

Fixed gear 54 is attached to fixed base member 34 by a riser 146. As the shaft 148 of motor 50 is caused to rotate, the entire rotary plate 38 is caused to rotate due to the engagement of drive chain 56 with fixed gear 54.

With additional reference to FIG. 6, gear teeth 150 are provided in post 44 to form a rack with which pinion 130 is engaged. As the shaft 132 of motor 58 is rotated, the engagement of pinion 130 with gear teeth 150 causes support plate 40 to move up and down along posts 42 and 44. The outer casing of motor 58 is firmly attached to motor support 59 which, in turn, is firmly attached to the outer casing 140 of slide bearing assembly 48.

Also seen in FIG. 5 is the inner core 100 of arm assembly 18. The inner core serves to rigidly attach frame member 96 to frame member 98, and provides separation between opposing sides of drive chain 102. A series of pins 152 extending between frame members 96 and 98 are used to hold the arm assembly 18 together.

While this invention has been described in terms of a few preferred embodiments, it is contemplated that persons reading the preceding descriptions and studying the drawing will realize various alterations, permutations and modifications thereof. It is therefore intended that the following appended claims be interpreted as including all such alterations, permutations and modifications as fall within the true spirit and scope of the present invention.

What is claimed is:

1. A tranfer arm mechanism comprising:
   a base assembly,
   turntable means coupled to said base assembly for rotation about a vertical axis,
   an elongated arm having an upper end and a lower end, said lower end supported by said turntable means at a pivot,
   said arm extending generally upwardly relative to said base assembly,
   support means coupled proximate said upper end of said arm for supporting and transferring a load, at least a portion of said support means having a planar surface,
   drive means for pivoting said elongated arm at said pivot, said pivoting providing horizontal movement to said upper end of said elongated arm,
   arm guide means coupled to said elongated arm for maintaining said upper end of the arm in a substantially horizontal plane during said pivoting of said arm, and
   vertical drive means coupled between said turntable means and said base assembly for vertically driving said turntable means along said vertical axis.

2. The transfer arm mechanism of claim 1 wherein said turntable means includes turntable drive means coupled between said turntable means and said base assembly for rotating said turntable means.

3. A transfer arm mechanism comprising,
   a base assembly,
   turntable means coupled to said base assembly for rotation about a vertical axis,
   an elongated arm having an upper end and a lower end, said lower end supported by said turntable means at a pivot, said arm extending generally upwardly relative to said base assembly.
   support means coupled proximate said upper end of said arm for supporting and transferring a load, at least a portion of said support means having a planar surface,
   drive means for pivoting said elongated arm at said pivot, said pivoting providing horizontal movment to said upper end of said elongated arm, and
   cam means coupled to said elongated arm for maintaining said upper end of the arm in a substantially horizontal plane during said pivoting of said arm, said cam means having a cam follower coupled to said arm and a fixed cam member coupled to said turntable means, said cam follower engaging an arcuate cam surface of said cam member, said transfer arm mechanism having a means for self-actingly varying the vertical position of said arm relatively said turntable means as said cam follower moves along said cam surface.

4. The transfer arm mechanism of claim 3 wherein said cam surface is concave and said means for varying the vertical position of said support means is a slide bearing assembly slidably coupling said elongated arm to said turntable means.

5. The transfer arm mechanism of claim 3 further comprising a slave assembly having a first gear, a second gear and linkage coupling said first and second gears, said first gear being fixed relative to said base assembly during said pivoting of said arm, said support means pivotally coupled to said arm coaxially with said second gear, whereby pivoting of said arm causes a counter-pivoting motion of said support means to maintain said planar surface of said support means in a substantially horizontal orientation.

6. The transfer arm mechanism of claim 1 wherein said support means includes a substantially planar paddle member having a means for supporting a semiconductor wafer.

7. A transfer arm mechanism for semiconductor wafers comprising,
a fixed base assembly,
a turntable assembly coupled to said base assembly for rotation about a vertical axis,
a turntable drive means for rotating said turntable assembly about said vertical axis,
an elongated arm having a first end in communication with said turntable assembly at a first pivot for rotation therewith, said elongated arm extending generally upwardly,
a semiconductor wafer support means attached to a second end of said elongated arm opposite said first end, at least a portion of said wafer support means having a planar surface,
arm drive means for pivoting said elongated arm at said first pivot to provide horizontal motion to said wafer support means,
vertical drive means connected between said base assembly and said turntable assembly for providing vertical lift to said arm, and
cam means for maintaining said second end of the elongated arm along a substantially horizontal plane during pivoting of said elongated arm at said first pivot, said cam means having a cam follower coupled to said elongated arm and having a cam member fixed to said turntable assembly, said cam member having an arcuate cam surface for receiving said cam member.

8. The transfer arm mechanism of claim 7 further comprising a slave assembly having a first gear, a second gear and linkage coupling said first and second gears, said first gear being fixed relative to said base assembly during the pivoting of said arm, said support means pivotally coupled to said arm coaxially with said second gear, whereby pivoting of said arm causes a counter-pivoting motion of said suport means to maintain said planar surface of the support means in a substantially horizontal orientation.

9. The transfer arm mechanism as recited in claim 7 wherein said turntable assembly includes a rotary plate and a support plate coupled to said rotary plate and adapted to rotate therewith, said vertical drive means coupled between said rotary plate and said support plate for vertical lift of said support plate relative to said rotary plate, said elongated arm and said cam member being supported by said support plate.

* * * * *